(12) United States Patent
Ao et al.

(10) Patent No.: US 12,732,602 B2
(45) Date of Patent: Sep. 8, 2026

(54) SYSTEM AND METHOD FOR MEASURING POWER CONSUMPTION OF IMAGE CAPTURING APPARATUS

(71) Applicant: Alpha Networks Inc., Hsinchu (TW)

(72) Inventors: Shih-Fang Ao, Hsinchu (TW); Chien-Hsiang Chen, Hsinchu (TW); Jen-Hung Yang, Hsinchu (TW)

(73) Assignee: ALPHA NETWORKS INC., Hsinchu (TW)

( * ) Notice: Subject to any disclaimer, the term of this patent is extended or adjusted under 35 U.S.C. 154(b) by 0 days.

(21) Appl. No.: 19/288,328

(22) Filed: Aug. 1, 2025

(65) Prior Publication Data

US 2026/0113428 A1 Apr. 23, 2026

(30) Foreign Application Priority Data

Oct. 22, 2024 (TW) ................................ 113140156

(51) Int. Cl.
*H04N 17/00* (2006.01)
*G01R 21/133* (2006.01)

(52) U.S. Cl.
CPC ......... *H04N 17/002* (2013.01); *G01R 21/133* (2013.01)

(58) Field of Classification Search
CPC ..... H04N 17/00; H04N 17/002; G01R 21/133
USPC .......................................................... 348/187
See application file for complete search history.

(56) References Cited

U.S. PATENT DOCUMENTS 9,262,913 B2 * 2/2016 Yamada ................. G08C 17/02
9,395,397 B2 * 7/2016 Liu ........................ G01R 21/06
9,819,261 B2 * 11/2017 Yamazaki ............ H04B 1/1615
11,375,018 B2 * 6/2022 Binder .................... H04L 67/12
11,792,374 B1 * 10/2023 Chang ................. H04N 9/3144 348/748
12,218,789 B2 * 2/2025 Lee ..................... H04L 27/2662
2020/0342607 A1 10/2020 Hoshino et al.
2022/0174207 A1 6/2022 Shigeta
2024/0401258 A1 * 12/2024 Park ........................ D06F 33/46

FOREIGN PATENT DOCUMENTS

CN 110824243 2/2020
CN 114648623 6/2022
CN 115706851 2/2023

* cited by examiner

*Primary Examiner* — Trang U Tran
(74) *Attorney, Agent, or Firm* — WPAT, PC

(57) ABSTRACT

A system and method for measuring power consumption of an image capturing apparatus comprises configuring a signal shielding box, an external antenna mounted on outer side thereof, and a wireless signal accessing apparatus and a signal attenuation apparatus inside the signal shielding box so that the signal attenuation apparatus transmits an external electronic signal having an antenna signal strength through the external antenna in response to receiving an internal electronic signal having an original signal strength from the wireless signal accessing apparatus; configuring a light emitting apparatus and a heating apparatus to simulate illumination and infrared radiation source for the image capturing apparatus, respectively; performing a plurality of comprehensive tests having various testing conditions to obtain respective energy consumption values of the image capturing apparatus; and calculating the power consumption value based on the energy consumption values.

4 Claims, 7 Drawing Sheets

SYSTEM AND METHOD FOR MEASURING POWER CONSUMPTION OF IMAGE CAPTURING APPARATUS

FIELD OF THE INVENTION

The present invention relates to a system and method for measuring performance of image capturing apparatus. Specifically, the present invention relates to a system and method for measuring power consumption of image capturing apparatus.

BACKGROUND OF THE INVENTION

For a user, it is important to know how long an image capturing apparatus powered by a built-in battery can operate. However, as the functions integrated into existing image capturing apparatuses increase, for example, motion detection during active or standby periods of the image capturing apparatus, synchronization of captured images to the cloud through a wireless network, object detecting using infrared radiation, ambient illumination, etc., measuring the battery's operating duration has become a highly labor-intensive and time-consuming process.

SUMMARY OF THE INVENTION

Accordingly, one objective of the present invention is to provide a system for measuring power consumption of an image capturing apparatus, wherein a plurality of ambient conditions are simulated within the same test space so that power consumption associated with operating different functions of the image capturing apparatus can be measured.

Another objective of the present invention is to provide a method for measuring power consumption of an image capturing apparatus, wherein power consumption associated with operating different functions of the image capturing apparatus can be automatically measured.

In one aspect, the present invention provides a system for measuring power consumption of an image capturing apparatus, wherein the system is adapted to measure a power consumption value of a power supplier installed in the image capturing apparatus operated in different modes. The system comprises a signal shielding box for shielding wireless signals originating from outside of the signal shielding box; an external antenna mounted on an outer side of the signal shielding box and configured to transmit wireless signals; a wireless signal accessing apparatus disposed within the signal shielding box; a signal attenuation apparatus disposed within the signal shielding box, wherein the signal attenuation apparatus is configured to transmit and receive an internal electronic signal to and from the wireless signal accessing apparatus through a wired connection, and to transmit an external electronic signal through the external antenna, wherein the external electronic signal is obtained by attenuating a signal strength of the internal electronic signal by a predetermined ratio; a light emitting apparatus configured to emit light to illuminate a test space captured by the image capturing apparatus; a heating apparatus comprising a heating portion and a non-heating portion; a temperature sensing apparatus configured to sense temperature of the heating portion for obtaining a heating portion temperature and to sense temperature of the test space for obtaining an ambient temperature; and a processor electrically coupled to the signal attenuation apparatus, the light emitting apparatus, the heating apparatus, the temperature sensing apparatus and the image capturing apparatus, respectively, wherein the processor is configured to provide an adjustment signal to the signal attenuation apparatus to control the predetermined ratio, to provide an illumination control signal to the light emitting apparatus to control whether the light emitting apparatus emits light, and to provide a heat control signal to the heating apparatus to control whether the heating apparatus operates, wherein, the processor obtains the heating portion temperature and the ambient temperature from the temperature sensing apparatus to determine whether the heating apparatus operates based on the heating portion temperature and the ambient temperature, and obtains a power status of the power supplier from the image capturing apparatus to provide the power consumption value accordingly.

In one embodiment, the processor comprises a power monitoring apparatus electrically coupled to the image capturing apparatus for obtaining the power status; and a control apparatus electrically coupled to the signal attenuation apparatus, the light emitting apparatus, the heating apparatus, the temperature sensing apparatus, the image capturing apparatus and the power monitoring apparatus, respectively, wherein the control apparatus is configured to provide the adjustment signal to the signal attenuation apparatus, provide the illumination control signal to the light emitting apparatus, provide the heat control signal to the heating apparatus, determine whether the heating apparatus operates based on the heating portion temperature and the ambient temperature obtained from the temperature sensing apparatus, and provide the power consumption value based on variation of the power status obtained from the power monitoring apparatus.

In one embodiment, the heating portion and the non-heating portion are alternately oriented to face the image capturing apparatus while the heating apparatus operates.

In a further embodiment, the heating apparatus rotates at a fixed position such that the heating portion and the non-heating portion are alternately oriented to face the image capturing apparatus.

In another aspect, the present invention provides a method for measuring power consumption of an image capturing apparatus, which is adapted to measure a power consumption value of a power supplier installed in the image capturing apparatus operated in different modes, wherein the method is characterized in comprising: configuring the image capturing apparatus to capture a test space; configuring a signal shielding box such that an external antenna mounted on an outer side of the signal shielding box is capable of wirelessly transmitting and receiving an external electronic signal to and from the image capturing apparatus; configuring a wireless signal accessing apparatus and a signal attenuation apparatus in the signal shielding box, wherein the signal attenuation apparatus transmits and receives an internal electronic signal to and from wireless signal accessing apparatus through a wired connection, and the signal attenuation apparatus transmits the external electronic signal having an antenna signal strength through the external antenna in response to receiving the internal electronic signal having an original signal strength from the wireless signal accessing apparatus; configuring a light emitting apparatus to control an illumination level of the test space; configuring a heating apparatus such that a heating portion thereof generates heat to serve as an infrared radiation source in the test space; performing a plurality of comprehensive tests to obtain respective energy consumption values; and calculating the power consumption value based on the energy consumption values. Wherein, each of the comprehensive tests comprises: performing one of a plurality of test items defined in a test set, wherein each of the test items comprises performing or not performing a first test operation, performing or not performing a second test operation, and performing or not performing a third test operation; and measuring energy consumed by the power supplier upon completion of each of the test items as the energy consumption value corresponding to the completed test item.

In one embodiment, the first test operation comprises simulating distance variation between the wireless signal accessing apparatus and the image capturing apparatus by varying the antenna signal strength, the second test operation comprises simulating illumination conditions during day and night image capture by controlling whether the light emitting apparatus is turned on, and the third test operation comprises triggering object detection functionality of the image capturing apparatus by changing status of the heating apparatus.

In one embodiment, the first test operation comprises: selecting a distance range to be simulated; determining a predetermined signal strength range based on the distance range to be simulated; adjusting the antenna signal strength based on relationship between a signal strength of the external electronic signal received by the image capturing apparatus and the predetermined signal strength range, until the signal strength of the external electronic signal received by the image capturing apparatus is within the predetermined signal strength range; and initiating communication between the image capturing apparatus and the wireless signal accessing apparatus through a wireless connection between the image capturing apparatus and the external antenna, and through the signal attenuation apparatus when the signal strength of the external electronic signal received by the image capturing apparatus is within the predetermined signal strength range.

In summary, the system for measuring power consumption of an image capturing apparatus disclosed herein provides a variety of ambient conditions such that testers can measure the power consumption of the image capturing apparatus in the same test space while the image capturing apparatus performs different functions. Furthermore, by adjusting the signal attenuation capability of the signal attenuation apparatus, the size of the test space required for wireless signal transmission and reception testing can be reduced. Additionally, the method for measuring power consumption of the image capturing apparatus disclosed herein automates the process of measuring the power consumed when the image capturing apparatus performs various functions, thereby reducing the manpower required for power consumption measurement.

BRIEF DESCRIPTION OF THE DRAWINGS

The invention will become more readily apparent to those ordinarily skilled in the art after reviewing the following detailed description and accompanying drawings, in which.

DETAILED DESCRIPTION OF PREFERRED EMBODIMENTS

The invention will now be described in further detail with reference to the following embodiments. It should be noted that the description of the embodiments provided herein is for purposes of illustration and description only, and is not intended to be exhaustive or to limit the invention to the precise forms disclosed.

It is also noted that, to facilitate understanding by those having ordinary skill in the art, "a first unit is electrically coupled to a second unit" means that electronic signals can be transmitted between the first unit and the second unit. Unless otherwise specified, such transmission of the electronic signals may be unidirectional or bidirectional, and the mode of transmission may be wired or wireless.

Figure 1:
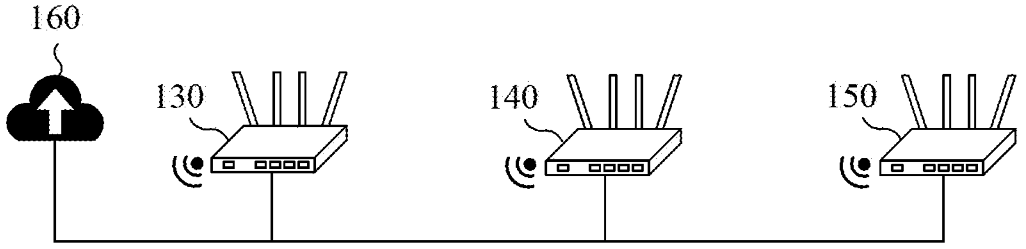
FIG. 1 is a schematic diagram of a system for measuring power consumption of an image capturing apparatus according to conventional techniques.
Figure 1:
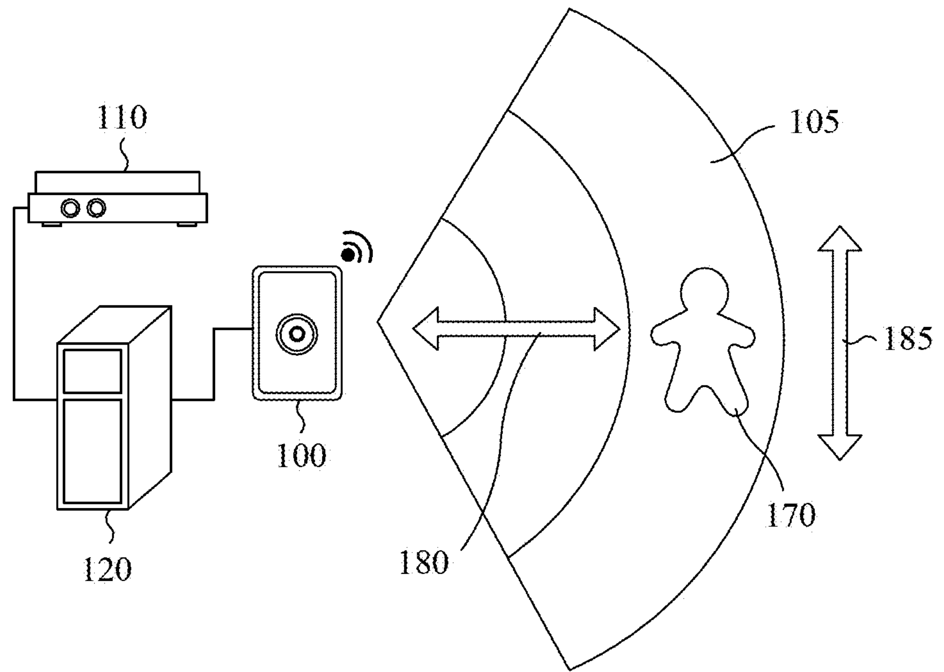

As shown in FIG. 1, in the conventional techniques, when measuring the power consumption of the image capturing apparatus 100, in addition to basically connect a power monitoring apparatus 110 to the battery of the image capturing apparatus 100 to obtain the battery voltage status, connect the control apparatus 120 to the image capturing apparatus 100 to control the work mode of the image capturing apparatus 100, and connect the power monitoring apparatus 110 to the control apparatus 120 to calculate the power consumption based on the battery voltage status obtained by the power monitoring apparatus 110, a spacious test space is necessary for placing the wireless signal accessing apparatuses 130, 140 and 150 spaced at various distances from the image capturing apparatus 100 to measure the power consumption of the image capturing apparatus 100 while communicating with these signal accessing apparatuses 130, 140 and 150, which provide different signal strength respectively, when the image capturing apparatus 100 is capable of wireless network connection. Furthermore, it might be necessary to arrange personnel 170 to move within the area covered by the sensing region 105 of the image capturing apparatus 100 in directions 180, 185, or a combination thereof, so as to trigger infrared sensing function of the image capturing apparatus 100 and measure the power consumption caused by the function. Also, it might be necessary to conduct tests under different weather and lighting conditions, including sunny, cloudy, rainy, or nighttime, so as to measure the power consumption of the image capturing apparatus 100 under different environments. Accordingly, it is obvious that, in conventional techniques, a spacious test area, additional labor costs, and appropriate environmental conditions are important factors for measuring the power consumption of the image capturing apparatus.

The system for measuring power consumption of the image capturing apparatus disclosed herein effectively reduces dependency on the aforementioned factors. Please refer to FIG. 2, which is a schematic diagram of a system for measuring power consumption of the image capturing apparatus in accordance with one embodiment of the present invention. In this embodiment, the system 20 is configured to measure a power consumption status of the power supplier 203 installed in the image capturing apparatus 200, such as lithium batteries or other power storage elements. The system 20 comprises a signal shielding box 230, a wireless signal accessing apparatus 232, a signal attenuation apparatus 234, a light emitting apparatus 240, a temperature sensing apparatus 250, a heating apparatus 260 and a processor, which comprises a power monitoring apparatus 210 and a control apparatus 220 in this embodiment.

Figure 2:
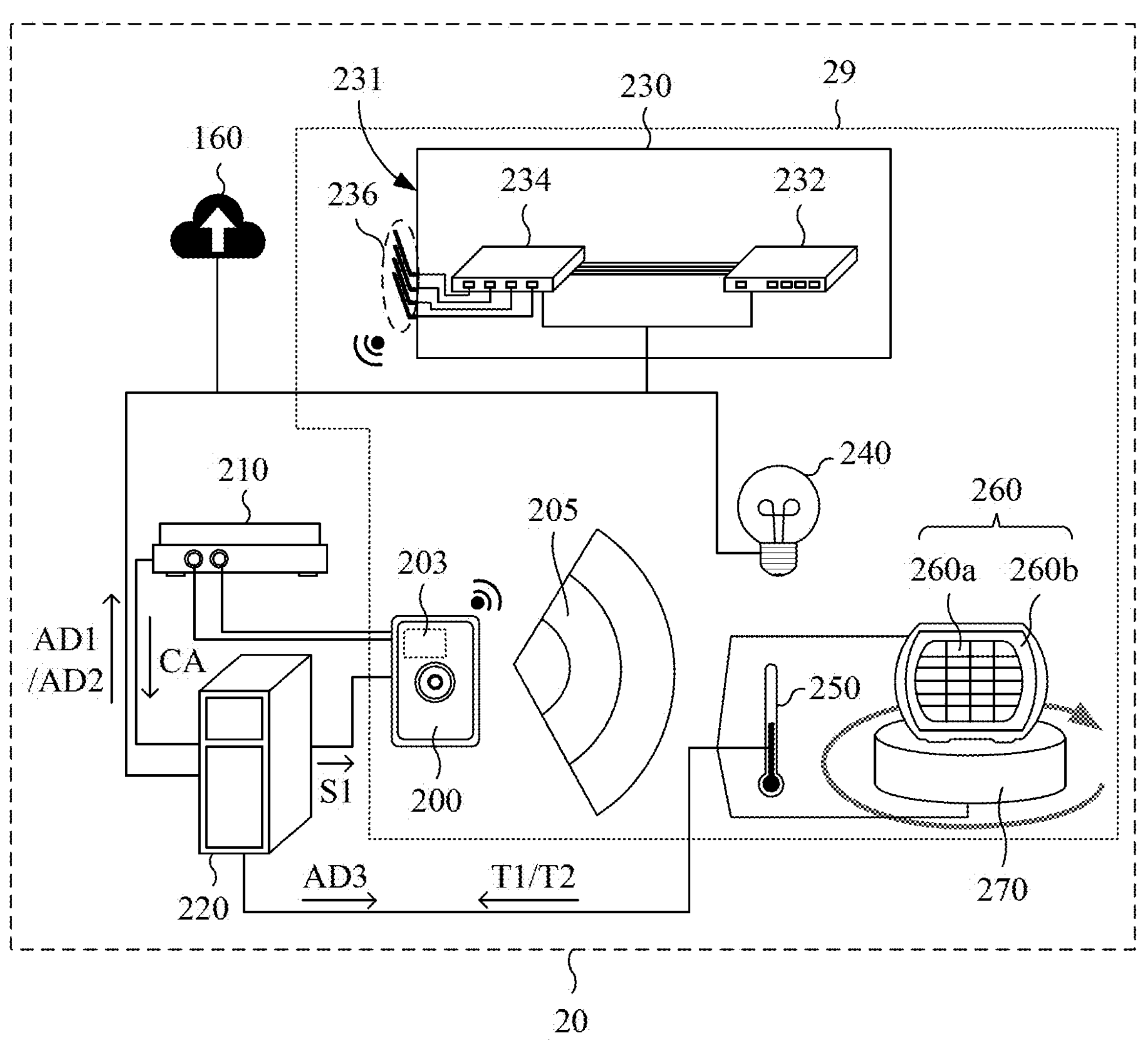
FIG. 2 is a schematic diagram of a system for measuring power consumption of an image capturing apparatus in accordance with one embodiment of the present invention.
Figure 3:
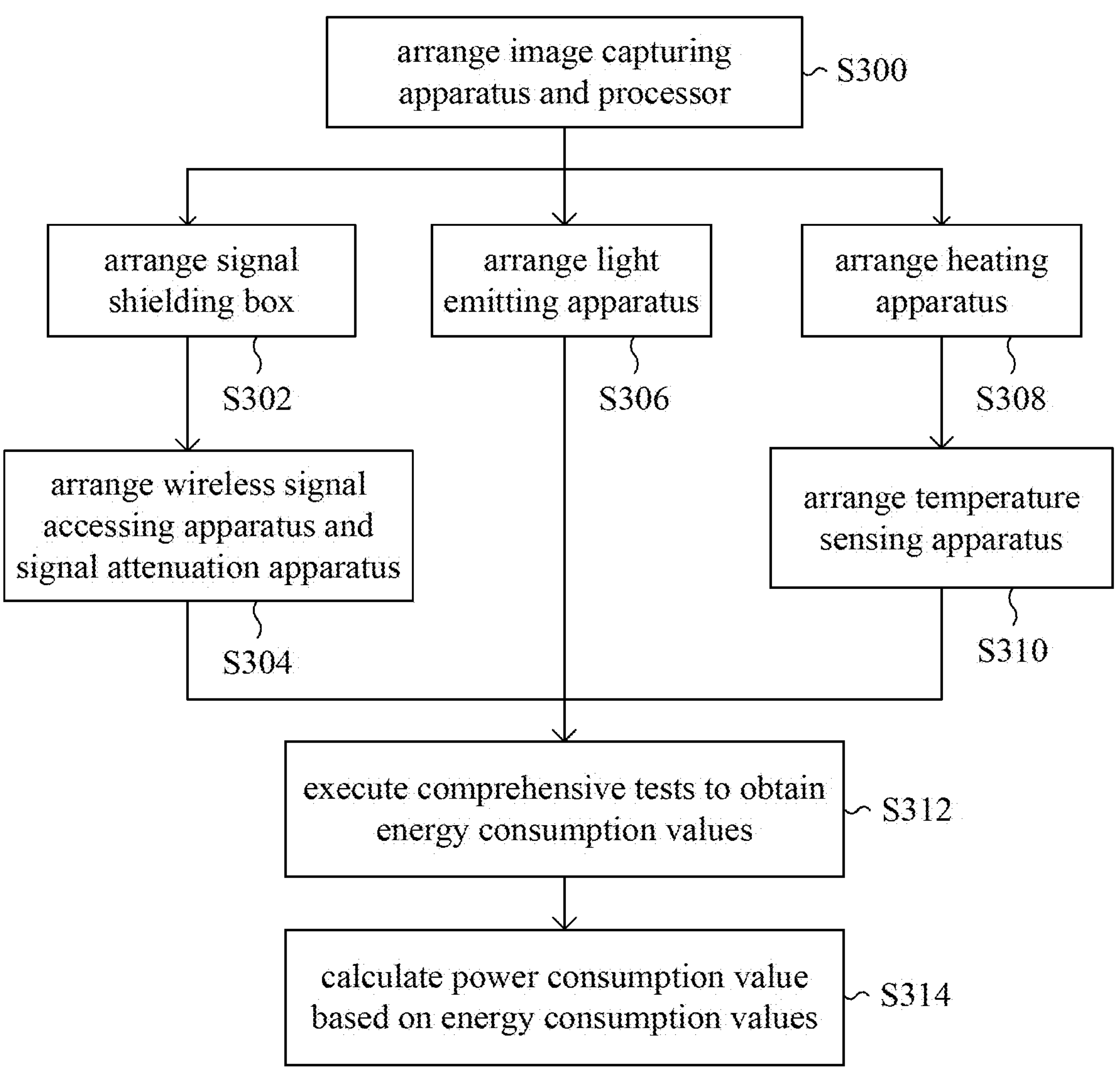
FIG. 3 is a flow chart of a method for measuring power consumption of the image capturing apparatus in accordance with one embodiment of the present invention.

To facilitate understanding of the principle of operation of the system 20 shown in FIG. 2 by those skilled in the art, detailed descriptions are provided hereinafter with reference to FIG. 2 and FIG. 3, wherein FIG. 3 is a flow chart of a method for measuring power consumption of the image capturing apparatus in accordance with one embodiment of the present invention. It should be understood that, in this embodiment, the sequence in which the devices are arranged does not affect the implementation results of the system or method provided herein. Accordingly, the scope of the present invention is not limited to the order of steps illustrated in FIG. 3. Those with ordinary skill in the art may adjust the execution sequence of the respective operations as needed, without departing from the spirit and scope of the present invention.

As shown in the figures, in this embodiment, the position of the image capturing apparatus 200 is determined in step S300, thereby defining the parameters such as coverage of a test space 29 captured by the image capturing apparatus 200, coverage of a wireless signal transmitted to or from the image capturing apparatus 200, and coverage of a infrared sensor and movement sensor used by the image capturing apparatus 200. In addition, the processor may be electrically coupled to the image capturing apparatus 200 via wired connection in this stage so that the processor can issue instructions to operate the image capturing apparatus 200 or receive data therefrom.

In this embodiment, after determining the position of the image capturing apparatus 200, step S302 is performed to properly arrange the signal shielding box 230, and step S304 is performed to install the wireless signal accessing apparatus 232 and the signal attenuation apparatus 234. Additionally, step S306 is performed to properly arrange the light emitting apparatus 240, and steps S308 and S310 are performed to properly arrange the heating apparatus 260 and the temperature sensing apparatus 250, respectively. It should be noted that the term "properly arrange an item" as used herein refers to arranging the item at a position such that normal interactions between the item and any other relevant components can be effectively performed. For example, to trigger various functions of the image capturing apparatus 200 through the apparatuses installed in the system 20, the signal shielding box 230 and the image capturing apparatus 200 are arranged at positions where wireless signals can be effectively transmitted therebetween, and the heating apparatus 260 is arranged at the position within the sensing range 205 of the image capturing apparatus 200, where an infrared sensor and/or movement sensor installed in the image capturing apparatus 200 is capable of effectively detecting objects.

After the completion of steps S300 to S310, technicians may construct a hardware structure suitable for measuring the power consumption of the image capturing apparatus 200, as illustrated in FIG. 2. Specifically, because the processor in the embodiment shown in FIG. 2 comprises the power monitoring apparatus 210 and the control apparatus 220, after completing step S300, the power monitoring apparatus 210 is arranged at the position where it can be electrically coupled to the image capturing apparatus 200, and the control apparatus 220 is arranged at the position where it can be electrically coupled, either directly by wireless or wired connection, or indirectly through the network 160 by wireless or wired connection, to the image capturing apparatus 200, the power monitoring apparatus 210, the signal attenuation apparatus 234, the light emitting apparatus 240, the temperature sensing apparatus 250, and the heating apparatus 260.

By electrically coupling the power monitoring apparatus 210 to the image capturing apparatus 200 or even to the power supplier 203 directly, the power monitoring apparatus 210 can obtain power status, such as the current power capacity, the provided voltage, or the output current, of the power supplier 203 installed within the image capturing apparatus 200. By electrically coupling the control apparatus 220 to the image capturing apparatus 200, the control apparatus can issue instruction S1 to instruct the image capturing apparatus to perform various functions. By electrically coupling the control apparatus 220 to the power monitoring apparatus 210, the control apparatus 220 can obtain power information CA, which contains the power status of the power supplier 203 or the variation thereof, from the power monitoring apparatus 210, wherein the power information CA can be used for calculating the aforementioned power consumption value. By electrically coupling the control apparatus 220 to the signal attenuation apparatus 234, the control apparatus 220 can issue an adjustment signal AD1 to the signal attenuation apparatus 234 to adjust a predetermined ratio by which the signal strength is reduced during the signal strength attenuation operation. By electrically coupling the control apparatus 220 to the light emitting apparatus 240, the control apparatus 220 can issue an illumination control signal AD2 to the light emitting apparatus 240 to control whether it is activated or to further adjust its brightness. By electrically coupling the control apparatus 220 to the temperature sensing apparatus 250, the control apparatus 220 can obtain from the temperature sensing apparatus 250 a heating portion temperature T1 detected from a heating portion 260*a* of the heating apparatus 260 and an ambient temperature T2 detected from the test space 29. By electrically coupling the control apparatus 220 to the heating apparatus 260, the control apparatus 220 can issue a heat control signal AD3 to the heating apparatus 260 based on the heating portion temperature T1 and the ambient temperature T2, so as to determine whether the heating apparatus 260 operates.

In addition, in the embodiment illustrated in FIG. 2, the signal shielding box 230 is adapted to shield wireless signals originating from outside of the signal shielding box 230. Accordingly, by implementing steps S302 to S304, the wireless signal accessing apparatus 232 and the signal attenuation apparatus 234 are disposed within the signal shielding box 230 and configured to be connected to each other via a wired connection such as an RF cable. Furthermore, the external antenna 236 is mounted on an outer side 231 of the signal shielding box 230 and is configured to be connected to the signal attenuation apparatus 234 via a signal wire. The external antenna 234 is further arranged at a position where wireless signals can be transmitted between the signal attenuation apparatus 234 and the image capturing apparatus 200. By applying the hardware structure described above, an internal electronic signal, which is the electronic signal transmitted from the wireless signal accessing apparatus 232 via the wired connection, can be received by the signal attenuation apparatus 234. Thereafter, the signal attenuation apparatus 234 may perform the signal strength attenuation operation to reduce the signal strength (hereinafter referred to as an original signal strength) of the received internal electronic signal, by the predetermined ratio thereby obtaining a reduced signal strength (hereinafter referred to as an antenna signal strength). The internal electronic signal is transmitted outward from the external antenna 236 with the antenna signal strength as an external electronic signal, which can be received and further processed by the image capturing apparatus 200. At the same time, after receiving the electronic signal transmitted outward from the image capturing apparatus 200, the external antenna 236 may transmit the received electronic signal to the wireless signal accessing apparatus 232 through the signal attenuation apparatus 234 via the wired connection.

Furthermore, after completing step S306, the light emitting apparatus 240 may be arranged at a position where the test space 29 captured by the image capturing apparatus 200 can be illuminated by the light emitting apparatus 240, and the light emitted therefrom simulates daylight brightness in the test space 29 while it is turned on.

Please refer to FIG. 2. In this embodiment, the heating apparatus 260 comprises the heating portion 260*a* and the non-heating portion 260*b*, wherein the heating portion 260*a* comprises heating elements which are capable of increasing or decreasing the surface temperature thereof by any method, so that the heating portion 260*a* is configured as an infrared radiation source within the test space 29. The non-heating portion 260*b* is made of materials having low thermal conductivity or temperature variation, so that the heating apparatus 260 can be held or moved easily, or, in another aspect, the non-heating portion 260*b* is configured to exhibit lower temperature variation compared to the heating portion 260*a*. When the image capturing apparatus 200 provides only infrared sensing capability, the heating apparatus 260, which has been installed by performing step S308, may be arranged such that the heating portion 260*a* is located within the sensing range 205 of the infrared sensor of the image capturing apparatus 200 and faces the image capturing apparatus 200. When the image capturing apparatus 200 provides motion sensing capability, the heating apparatus 260 may be disposed on a movable base 270 and placed within the sensing range 205 of the motion sensor. Thereafter, after setting the position of the heating apparatus 260 via step S308, this embodiment proceeds to perform step S310 to configure the position of the temperature sensing apparatus 250. The temperature sensing apparatus 250 arranged by step S310 is disposed at a position where both the temperature of the heating portion and the ambient temperature can be detected.

After the devices have been arranged through steps S300 to S310, the flow illustrated in FIG. 3 proceeds to step S312, in which a plurality of comprehensive tests are executed, and an energy consumption value corresponding to each execution of the comprehensive test is obtained. In the present embodiment, a plurality of test items may be predefined by technical personnel and included in a test set, such that each execution of the comprehensive test in step S312 can be completed by executing one of the predefined test items. For example, when the image capturing apparatus is capable of providing three functions including automatic connection to a wireless network, a nighttime operation mode, and motion detection (generally implemented by a position detector such as a radar), it is possible for a test item to be configured to perform any combination of the following three test operations, each lasting over a certain duration: enabling the wireless network, enabling the nighttime operation mode, and enabling motion detection.

In one embodiment, when configuring whether to perform the test operation of enabling the wireless network, it is simply configured whether the wireless network function of the image capturing apparatus 200 is turned on or off; however, in other embodiments, when configuring whether to perform the test operation of enabling the wireless network, in addition to configuring whether the wireless network function of the image capturing apparatus 200 is turned on or off, the test operation can also be made to include simulating the change in distance between the wireless signal accessing apparatus 232 and the image capturing apparatus 200 by further changing the antenna signal strength when the wireless network is enabled, thereby allowing the impact on the energy consumption of the image capturing apparatus 200 caused by such distance variation to be tested.

Furthermore, in one embodiment, the configuration as to whether to perform the test operation of enabling the nighttime operation mode may be defined as whether the light emitting apparatus 240 is to be activated, thereby allowing the test space 29 to attain a brightness equivalent to that of daytime. In addition, in one embodiment, the configuration as to whether to perform the test operation of enabling motion detection may be defined by whether to change the current status of the heating apparatus 260, such as by moving or rotating the heating apparatus 260, thereby assisting in completing the operational procedure for triggering the motion sensor of the image capturing apparatus 200.

Please refer to FIG. 3 again. By selecting whether to perform the aforementioned test operations, various test items with different configurations can be set by technical personnel and grouped to form a test set prior to executing step S312. In step S312, when each test item is executed, the power monitoring apparatus 210 is further utilized to obtain the power consumed by the power supplier 203 over the whole execution of the test item, thereby allowing the power consumption corresponding to the whole execution of the test item, which is referred to as an energy consumption value, to be acquired. Each complete execution of the test operations defined by one test item is hereinafter referred to as the execution of one comprehensive test, wherein each test item to be executed may be selected from the predefined test set or temporarily created by combining the test operations on demand. It should be noted that although one energy consumption value can be obtained after the execution of one test item, a single test item is not limited to being executed only once. Those with ordinary skill in the art may modify the number of times each test item is executed based on actual requirements, thereby allowing corresponding energy consumption values to be acquired for use in subsequent processes.

Subsequently, after the required number of comprehensive tests defined in step S312 have been completed and the corresponding number of energy consumption values have been obtained, the process proceeds to step S314, in which the power consumption value of the image capturing apparatus 200 is calculated based on the obtained energy consumption values.

Figure 4A:
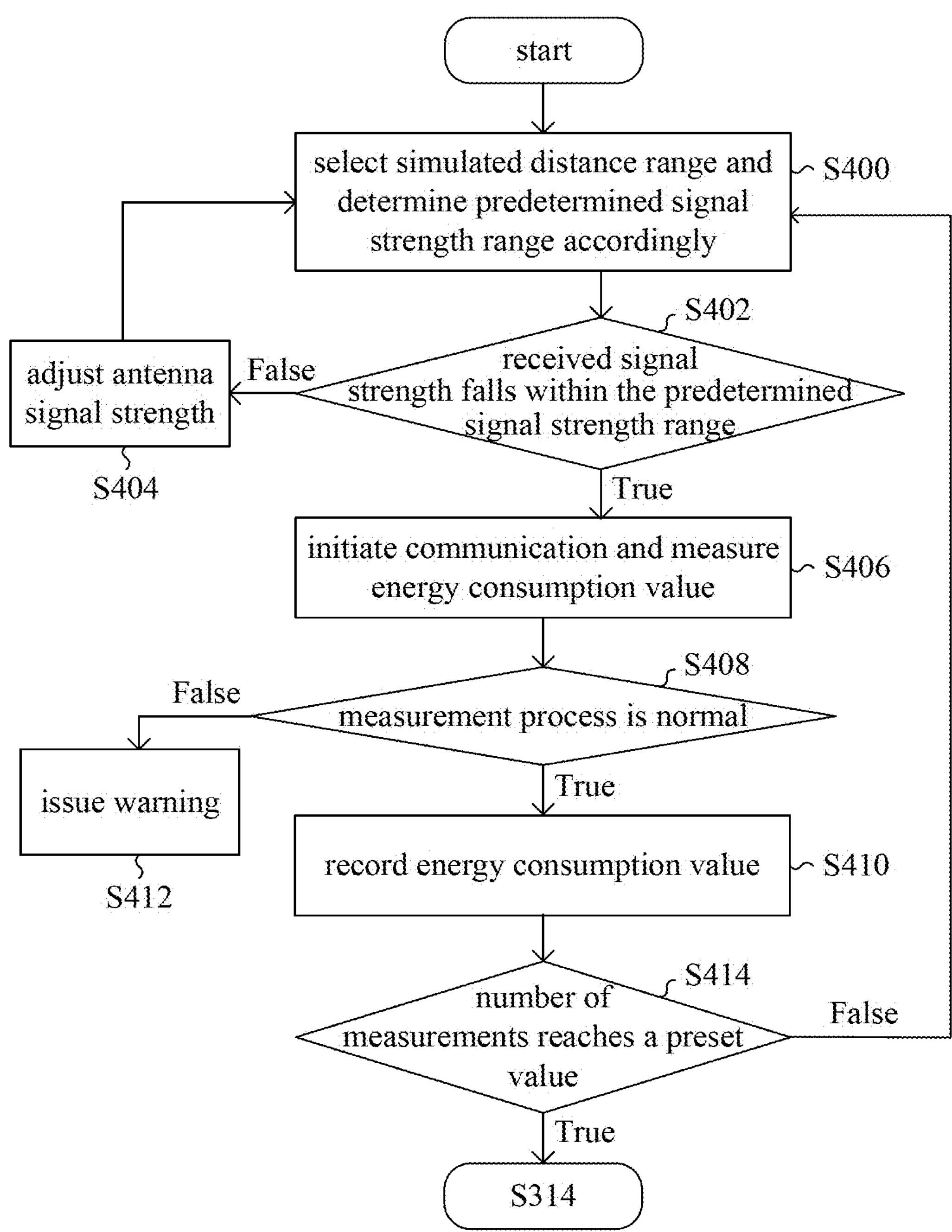
FIG. 4A is a flow chart showing details of step S312 in accordance with a first embodiment of the present invention.

Please also refer to FIG. 4A, which is a flow chart showing details of step S312 in accordance with a first embodiment of the present invention. In this embodiment, in step S400, the distance range between the image capturing apparatus 200 and the wireless signal accessing apparatus 232 to be simulated is first selected, and based on the selected distance range, a predetermined signal strength range, which corresponds to the expected range of signal strength of the external electronic signal when received by the image capturing apparatus 200, is then determined. In one embodiment, technicians may pre-store, in the control apparatus 220, a lookup table that records the simulated distance ranges between the image capturing apparatus 200 and the wireless signal accessing apparatus 232, along with the predetermined signal strength ranges associated with each simulated distance range. One example of the lookup table is shown in Table 1 as below:

TABLE 1

| Distance Range | Near-Range | Mid-Range | Far-Range |
|---|---|---|---|
| Predetermined Signal Strength Range | >−50 dB | −50 dB~−60 dB | <−70 dB |

In Table 1 above, the distance ranges are categorized into three types: near-range, mid-range, and far-range. However, as understood by those with ordinary skill in the art, the distance ranges may alternatively be defined with more specific numerical values. For example, the near-range may be revised to within 20 meters, the mid-range to 20 to 50 meters, and the far-range to greater than 50 meters. Of course, the distance ranges may be divided into a number other than three. The predetermined signal strength ranges associated with each distance range may be obtained through actual measurements or derived based on theoretical estimations. Such variations do not render the techniques provided by the present disclosure inapplicable, and those with ordinary skill in the art may make detailed adjustments as needed based on practical requirements.

It is noted that, in addition to the method described above, various other methods may also be employed to achieve the technical result required in step S400. Under the premise that the technical result required in step S400 can be achieved, other methods may be substituted based on actual needs by those with ordinary skill in the art to perform the operation of step S400. The present disclosure is not limited to the technical details described herein.

In this embodiment, by selecting the simulated distance range, the control apparatus 220 is able to identify, with reference to Table 1, the predetermined signal strength range within which the signal strength of the wireless signal expected to be received by the image capturing apparatus 200 (after being transmitted from the external antenna 236) should fall. After the predetermined signal strength range is identified in step S400, the signal strength of the external electronic signal that is actually received by the image capturing apparatus 200 from the external antenna 236 is obtained by the control apparatus 220 and it is determined whether the acquired signal strength falls within the identified predetermined signal strength range in step S402. When the signal strength of the external electronic signal received by the image capturing apparatus 200 falls within the predetermined signal strength range identified in step S400, the process proceeds to step S406, in which the image capturing apparatus 200 initiates communication with the wireless signal accessing apparatus 232 according to the normal procedure and the energy consumption value resulting from the communication is measured. Conversely, when the signal strength of the external electronic signal received by the image capturing apparatus 200 falls outside the predetermined signal strength range identified in step S400, the process proceeds to step S404, in which the antenna signal strength mentioned earlier is adjusted.

In step S404, when the signal strength of the external electronic signal received by the image capturing apparatus 200 is lower than the predetermined signal strength range identified in step S400, the adjustment signal AD1 may be transmitted by the control apparatus 220 to the signal attenuation apparatus 234, such that the predetermined ratio by which the signal strength is to be attenuated during the signal strength attenuation operation is reduced. Thereby, the antenna signal strength of the external electronic signal at the time it is emitted from the external antenna 236 can be increased, which in turn increases the signal strength of the external electronic signal as received by the image capturing apparatus 200. Conversely, when the signal strength of the external electronic signal received by the image capturing apparatus 200 is higher than the predetermined signal strength range identified in step S400, the control apparatus 220 may transmit the adjustment signal AD1 to the signal attenuation apparatus 234 so as to increase the predetermined ratio by which the signal strength is to be attenuated during the signal strength attenuation operation. Thereby, the antenna signal strength of the external electronic signal at the time it is emitted from the external antenna 236 can be reduced, which in turn decreases the signal strength of the external electronic signal as received by the image capturing apparatus 200.

Generally, in order to maintain the continuity of wireless communication, a wireless signal transmitting device may adjust the strength of its transmitted wireless signal based on variations in the signal strength of wireless signals received thereby. For example, when the wireless signal transmitting device detects that the signal strength of the wireless signal received from its communication counterpart has weakened, the wireless signal transmitting device may increase the strength of the wireless signal it transmits to that counterpart, thereby reducing the likelihood of communication interruption between the two parties. Accordingly, in order to obtain the varying power consumption generated by the image capturing apparatus 200 when communicating with wireless signal access nodes located at different distances, such as the wireless signal accessing apparatuses 130 to 150 shown in FIG. 1, the conventional approach requires physically deploying multiple wireless signal access nodes, which in turn necessitates the use of an extremely large test space. It is evident that, by employing the distance simulation techniques provided in steps S400 to S404, the size of the test space required to obtain the different power consumptions generated by the image capturing apparatus 200 when communicating with wireless signal access nodes at varying distances can be significantly reduced. Accordingly, the technique solution offered by the present invention clearly reduces the site selection threshold associated with such power consumption measurements.

Please refer to FIG. 4A again. After the communication is performed for a period of time in step S406 and the energy consumption value within this period is measured, it is then determined, in this embodiment, whether the measurement process is in a normal state in step S408. When the determination result of step S408 is false, it indicates that a problem may exist in the overall test system. As a result, the flow proceeds to step S412, in which a warning is issued and the subsequent testing is halted. In contrast, when the determination result of step S408 is true, the flow proceeds to step S410, in which the energy consumption value during the communication period is recorded. After the energy consumption value is recorded, the flow then proceeds to step S414, in which it is determined whether the number of times the energy consumption value has been measured has reached a preset value. If the determination result of step S414 is false, the flow returns to step S400 to perform the next measurement cycle. Conversely, if the determination result of step S414 is true, the energy consumption values recorded after each measurement cycle may then be used in step S314 for calculating a power consumption value.

In the embodiment illustrated in FIG. 4A, because no other functions of the image capturing apparatus 200 are activated, this embodiment may, in a practical example, be performed while the image capturing apparatus 200 is in a standby mode. While in the standby mode, the image capturing apparatus 200 may periodically communicate with the wireless signal accessing apparatus 232 to maintain the communication channel therebetween. Accordingly, under such a condition, the "communication performed for a period of time" as referred to in step S406 corresponds to the duration required to transmit at least a predetermined number of beacons within beacon intervals defined by the Delivery Traffic Indication Message (DTIM). For example, if the period to be measured corresponds to the time required for transmitting three beacons and the beacon interval defined by the DTIM is 400 milliseconds (ms), the duration referred to in step S406 should be set to at least 800 milliseconds. The maximum duration, however, may be configured as needed.

Figure 5:
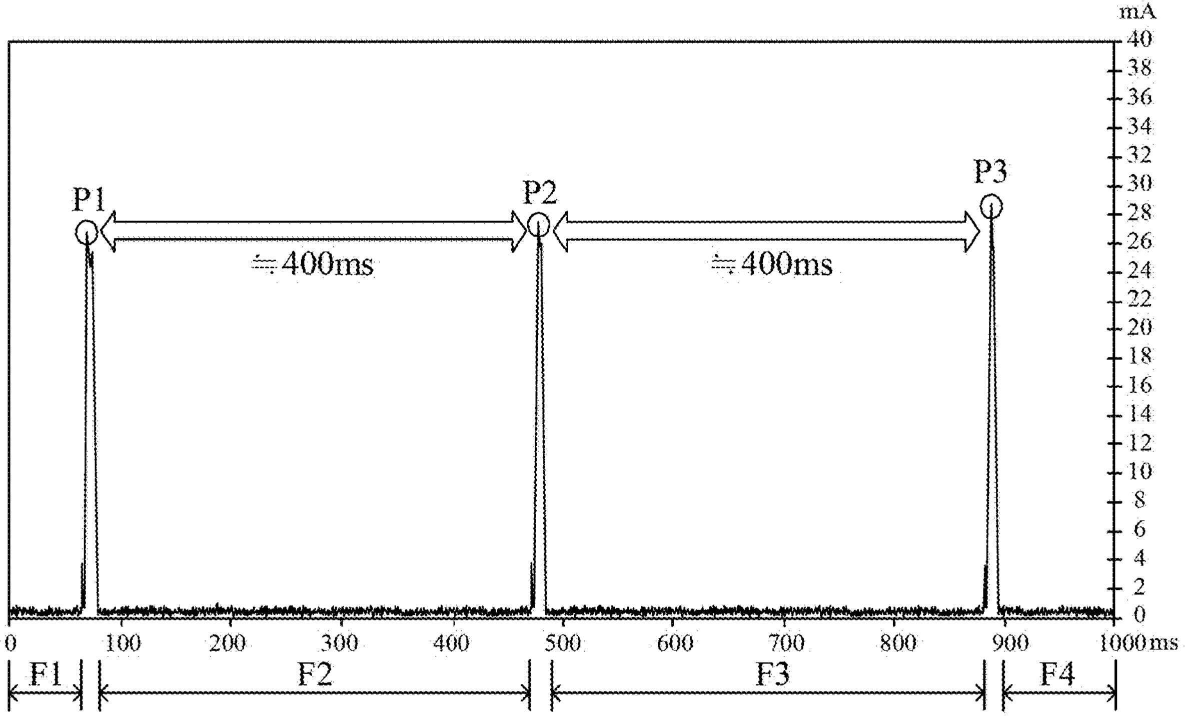
FIG. 5 is a schematic diagram showing power consumption measured during standby mode in accordance with one embodiment of the present invention.

Please refer to FIG. 5, which is a schematic diagram showing power consumption measured during standby mode in accordance with one embodiment of the present invention, wherein the horizontal axis represents time, and the vertical axis represents output current. As shown in this figure, the beacon interval in this embodiment is 400 milliseconds. By using the power monitoring apparatus 210 to acquire power consumption status from the power supplier 203, it can be observed that three current peaks P1, P2, and P3 occur during the measurement process due to the transmission of beacons. In addition, there are standby currents before and after each current peak, specifically: the standby current with a duration of F1 prior to the current peak P1, the standby current with a duration of F2 between the current peaks P1 and P2, the standby current with a duration of F3 between the current peaks P2 and P3, and the standby current with a duration of F4 after the current peak P3. The information illustrated in FIG. 5 is stored in the power monitoring apparatus 210 as the power information CA mentioned above and is made available for retrieval by the control apparatus 220.

In this embodiment, when issues such as the total measurement duration not falling within a normal range upon the occurrence of three current peaks, an abnormal standby current during the measurement process, or a significant discrepancy between the interval of two adjacent current peaks and the beacon interval defined by the DTIM are detected via step S408, the flow proceeds to step S412 due to the potential existence of problems within the overall test system. It should be noted that the criteria adopted in step S408 to determine whether the measurement process is in a normal state are not limited to the specific conditions described above. For example, those with ordinary skill in the art may alternatively define a specific time window such that the time window starts from half of the beacon interval after the generation of a beacon and extends through a total duration of 1200 milliseconds until half of a beacon interval after the expected generation of three beacons. The measurement process may then be evaluated for normalcy based on whether three current peaks and four standby current segments are observed within this time window.

Although multiple criteria for determining whether the measurement process is in a normal state have been provided in the present specification, the method for determining the status of the measurement process is not limited thereto. Those with ordinary skill in the art may, based on actual site conditions and practical requirements, determine the appropriate criteria to be referenced when assessing whether the measurement process is proceeding normally.

Furthermore, the embodiment illustrated in FIG. 4A may be regarded as a measurement process for measuring the power consumption of the image capturing apparatus 200 while only the wireless network function is enabled. However, as known to those with ordinary skill in the art, the wireless network function may be executed independently, or together with other functions of the image capturing apparatus 200, such as the activation of a nighttime operation mode and the activation of motion detection (e.g., enabling a radar for location detection). Accordingly, in other embodiments, the power consumption of these functions may be measured independently, or under combinations of two or even all three functions being simultaneously executed. A power consumption value corresponding to specific operational conditions may then be calculated, such as the maximum standby time, the longest daytime operation time, or the continuous nighttime operation duration of the image capturing apparatus 200.

Figure 4B:
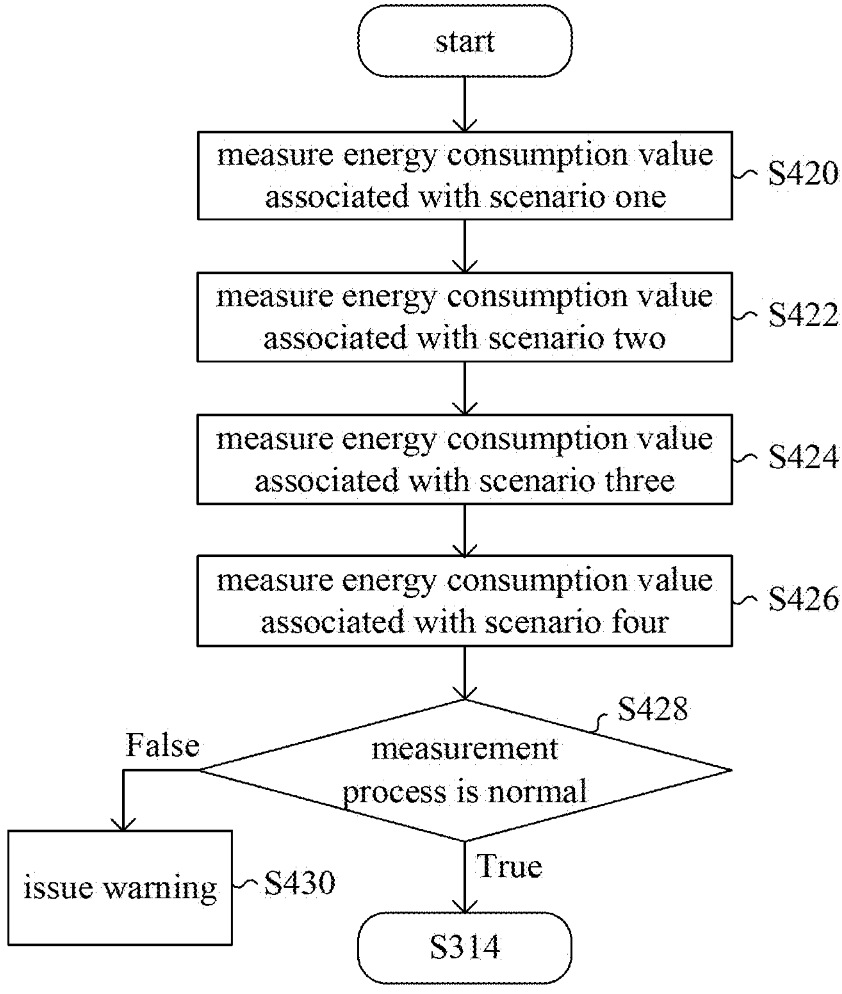
FIG. 4B is a flow chart showing details of step S312 in accordance with a second embodiment of the present invention.

Please refer to FIG. 4B, which is a flow chart showing details of step S312 in accordance with a second embodiment of the present invention.

This embodiment is intended to measure the energy consumption value of the image capturing apparatus 200 under various scenarios involving the use of a passive infrared sensor (PIR), thereby allowing the measured energy consumption values to be subsequently utilized for calculating the corresponding power consumption value. It is to be understood that those with ordinary skill in the art may, based on actual requirements, design corresponding scenarios to measure the energy consumption value associated with the operation of other functions of the image capturing apparatus 200. As illustrated in the figure, steps S420 to S426 are respectively utilized to measure the energy consumption values of the image capturing apparatus 200 under different operational scenarios. In step S420, the energy consumption value associated with the scenario one is measured, wherein the passive infrared sensor is maintained in activated state, and both the auxiliary lighting and the motion sensor of the image capturing apparatus 200 are also maintained in activated states. In step S422, the energy consumption value associated with scenario two is measured, wherein the passive infrared sensor and the auxiliary lighting of the image capturing apparatus 200 are maintained in activated states while the motion sensor is maintained in deactivated state. In step S424, the energy consumption value associated with scenario three is measured, wherein the passive infrared sensor and the motion sensor of the image capturing apparatus 200 are maintained in activated states while the auxiliary lighting is maintained in deactivated state. In step S426, the energy consumption value associated with scenario four is measured, wherein the passive infrared sensor is maintained in activated state, and both the auxiliary lighting and the motion sensor of the image capturing apparatus 200 are maintained in deactivated states.

During each of the measurement processes corresponding to steps S420 to S426, the power output status of the power supplier 203 may be obtained by the power monitoring apparatus 210, thereby allowing the generation of currentversus-time profiles similar to that illustrated in FIG. 5. Based on these profiles, the energy consumption value for each individual measurement may be calculated and recorded accordingly. After completion of the measurements for the aforementioned scenarios and the recording of the associated energy consumption values, the flow proceeds to step S428, in which a verification is performed to determine whether each component operates normally during the measurement period. For example, as in the scenarios described above, three functions of the image capturing apparatus 200 are activated in step S420, two functions of the image capturing apparatus 200 are activated in steps S422 and 424, respectively, only one function of the image capturing apparatus 200 is activated in step S426, and, in the present embodiment, the energy consumed by the auxiliary lighting is greater than that consumed by the motion sensor, therefore it could be understood that, when the components operates normally, the energy consumption value measured in step S420 should be the highest, followed by that in step S422, then step S424, and finally the lowest in step S426.

Accordingly, in step S428, whether the components involved in the measurement functioned properly may be preliminarily determined by examining the relative magnitudes of the energy consumption values under each scenario over the same time period. When the result of the determination in step S428 is false, the flow proceeds to step S430, in which a warning message is issued and further testing is terminated due to the potential malfunction of one or more components involved in the test. Conversely, when the determination result in step S428 is true, the flow proceeds to step S314, in which a power consumption value is calculated based on the recorded energy consumption values.

Figure 4C:
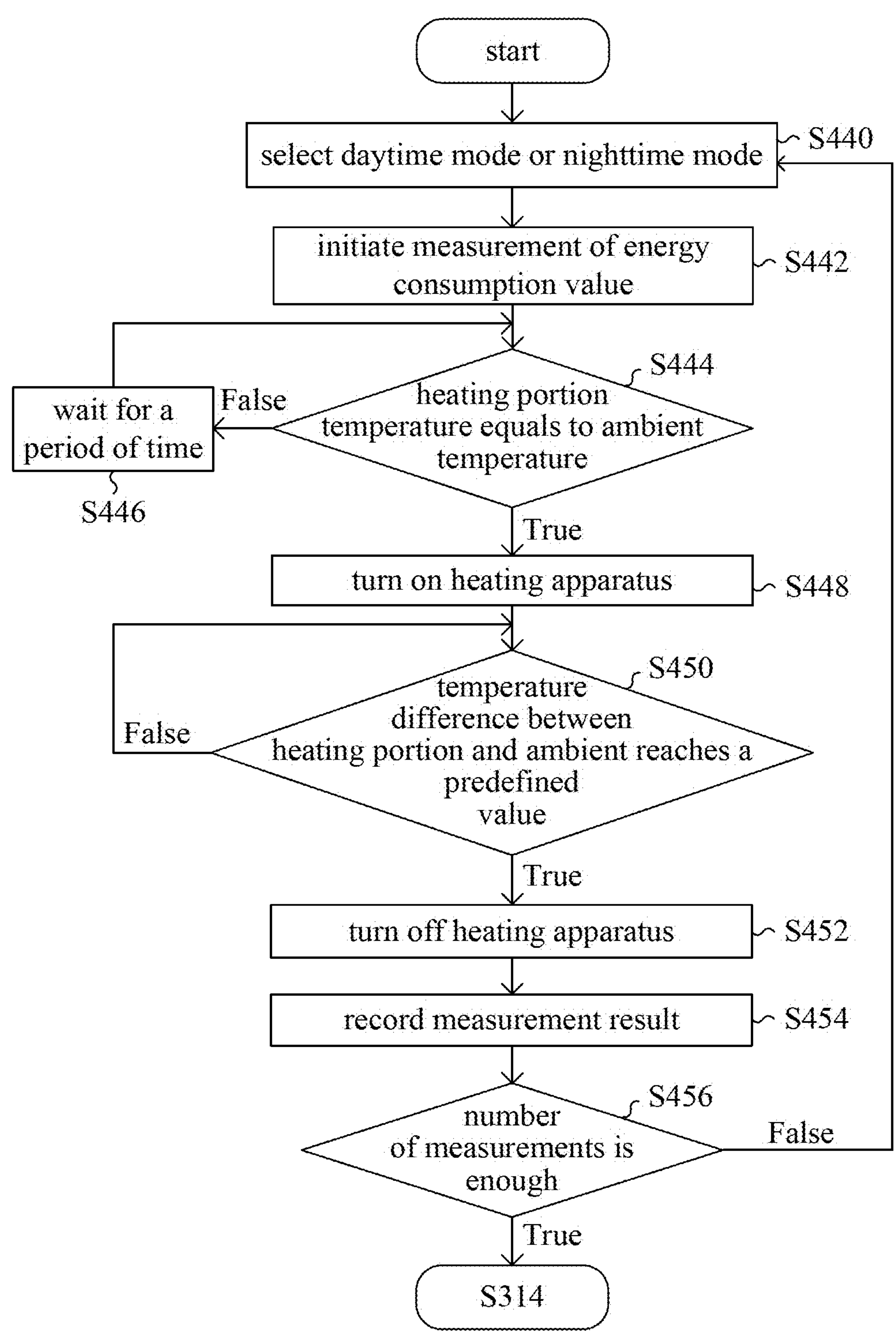
FIG. 4C is a flow chart showing details of step S312 in accordance with a third embodiment of the present invention.

In addition to the various power consumption measurement operations performed while the image capturing apparatus 200 is in a standby mode, the system 20 may further be utilized to measure the power consumption of the image capturing apparatus 200 during operations involving changes in ambient lighting or environmental recognition tasks. Please refer to FIG. 2 and FIG. 4C, wherein FIG. 4C is a flow chart showing details of step S312 in accordance with a third embodiment of the present invention. In the present embodiment, step S440 may first be executed to configure, via the control apparatus 220, whether the power consumption is to be measured while the image capturing apparatus 200 operates in a daytime mode or a nighttime mode. The control apparatus 220 may then transmit an illumination control signal AD2 to the light emitting apparatus 240 in accordance with the configured mode, so as to control whether the light emitting apparatus 240 is activated, or to further control the brightness level of the light emitting apparatus 240. When the daytime mode is selected, the illumination control signal AD2 may be transmitted by the control apparatus 220 to activate the light emitting apparatus 240 such that the brightness within the test space 29, which is captured by the image capturing apparatus 200, reaches a predefined level. Conversely, when the nighttime mode is selected, the illumination control signal AD2 may be transmitted by the control apparatus 220 to keep the light emitting apparatus 240 turned off.

After completing step S440, the control apparatus 220 may instruct the power monitoring apparatus 210 to begin recording the power output status of the power supplier 203 to initiate the measurement of the energy consumption value in step S442. Alternatively, in another implementation, the power monitoring apparatus 210 may continuously record the power output status of the power supplier 203, and the operation of initiating the measurement of the energy consumption value in step S442 may be performed by having the control apparatus 220 record the current time, so that the relevant time segment of power information CA to be retrieved from the power monitoring apparatus 210 may subsequently be identified accordingly. It should be noted that although the measurement of the energy consumption value is initiated immediately following the completion of step S440 in this embodiment, the present invention is not limited thereto. Those with ordinary skill in the art may still modify the timing for initiating and terminating the measurement of the energy consumption value based on practical requirements.

In the present embodiment, after the measurement of the energy consumption value is initiated, the system 20 first verify whether the temperature of the heating portion 260*a*, i.e., the previously defined heating portion temperature T1, is equal to the ambient temperature T2 in step S444. Specifically, the system 20 may utilize the temperature sensing apparatus 250 to detect both the heating portion temperature T1 and the ambient temperature T2, and the control apparatus 220 could retrieve these two values from the temperature sensing apparatus 250 and determine whether they are equal. When it is determined in step S444 that the heating portion temperature T1 is not equal to the ambient temperature T2, the flow proceeds to step S446, in which the control apparatus 220 is configured to wait for a predefined period of time. Upon completion of the predefined waiting period, the flow returns to step S444, where the heating portion temperature T1 and the ambient temperature T2 are retrieved again and re-compared. Conversely, when it is determined in step S444 that the heating portion temperature T1 is equal to the ambient temperature T2, the flow proceeds to step S448, in which the heating apparatus 260 is activated and a positional adjustment of the heating apparatus 260 is initiated.

As described in the embodiment illustrated in FIG. 2, the heating apparatus 260 is disposed on the movable base 270. In one embodiment, the movable base 270 and the heating apparatus 260 are together controlled by a heat control signal AD3 issued by the control apparatus 220, or the heating apparatus 260 and the movable base 270 are integrally formed as a single unit. In such a case, when the heating apparatus 260 is controlled to start heating by the heat control signal AD3, the movable base 270 is also synchronously activated. In another embodiment, the movable base 270 is provided independently of the heating apparatus 260. In this case, the control apparatus 220 not only controls the heating apparatus 260 to start heating by means of the heat control signal AD3 but also controls the movable base 270 by other means so as to initiate its operation. Further, the movable base 270 may be configured to rotate in place to change the position of the heating portion 260*a* such that the heating portion 260*a* and the non-heating portion 260*b* alternately face the image capturing apparatus 200. Alternatively, in addition to rotation, the movable base 270 may also be configured to move throughout the test space 29 to change the position of the heating portion 260*a*. When the movable base 270 is capable of free movement, it is preferable for the control apparatus 220 to transmit the heat control signal AD3 to the heating apparatus 260 and the movable base 270 through a wireless connection, though this is not a limitation of the present invention.

After the execution of step S448, the position of the heating portion 260*a* begins to change. At this time, a motion detection function of the image capturing apparatus 200 could be continuously triggered so as to track the position of the heating portion 260*a*. On the other hand, since the temperature of the heating portion 260*a* also starts to increase after the execution of step S448, a passive infrared sensor of the image capturing apparatus 200 may likewise be continuously triggered. Accordingly, after step S448 is executed, the power consumption of the image capturing apparatus 200 starts to increase.

Subsequently, the heating portion temperature T1 increases along with the activation time of the heating apparatus 260. Utilizing this characteristic, in the present embodiment, the heating apparatus 260 is turned off when the temperature difference between the heating portion temperature T1 and the ambient temperature T2 reaches a predefined value (e.g., 15° C.), thereby controlling the duration of the measurement operation. It should be noted that the duration of the measurement operation may be controlled in any manner without being limited to the specific approach provided in the present embodiment, and the present invention is not limited thereto. In this embodiment, after the execution of step S448, the control apparatus 220 periodically checks whether the temperature difference between the heating portion temperature T1 and the ambient temperature T2 has reached the predefined value in step S450. When the result of the determination in step S450 is false, the control apparatus 220 waits for a predetermined period of time and then repeats the checking operation of step S450. Conversely, when the result of the determination in step S450 is true, the control apparatus 220 may turn off the heating apparatus 260 and the movable base 270 by sending the heat control signal AD3 in step S452.

In one embodiment, after the heating apparatus 260 and the movable base 270 are turned off in step S452, the power monitoring apparatus 210 is instructed by the control apparatus 220 to stop recording the power output status of the power supplier 203. The parameters related to the energy consumption value obtained from this recording are stored for subsequent access by the control apparatus 220 in step S454. In another embodiment, the power monitoring apparatus 210 continuously records the power output status of the power supplier 203 as described above. In this case, the operation performed in step S454 to record the measurement result is implemented by the control apparatus 220 through recording the current time. This timestamp is then used together with the timestamp recorded in step S442 to identify the relevant time interval, and the corresponding power information CA is then retrieved from the power monitoring apparatus 210 based on this interval for calculating the energy consumption value.

After the measurement result is recorded in step S454, the control apparatus 220 is further configured to determine whether the number of measurements performed thus far has reached a predetermined target (step S456). When the number of measurements has not yet reached the predetermined target, the flow returns to step S440 to perform the next measurement. On the contrary, when the number of measurements has reached the predetermined target, the flow proceeds to step S314, in which the power consumption of the image capturing apparatus 200 is calculated using the energy consumption values recorded previously.

It should be noted that the embodiments illustrated in FIGS. 4A to 4C and described above are merely a few implementations of the power consumption measurement system 20 provided by the present invention. Those with ordinary skill in the art may design feasible operation procedures based on the architecture provided by the power consumption measurement system 20 in these embodiments and practical requirements. For example, the measurement methods illustrated in FIGS. 4A to 4C may be combined in pairs or all three together to perform the power consumption measurement. The technical scope of the present invention is not limited to the aforementioned embodiments.

By applying the technique solutions described above, the system for measuring power consumption of an image capturing apparatus disclosed herein provides a variety of ambient conditions such that testers can measure the power consumption of the image capturing apparatus in the same test space while the image capturing apparatus performs different functions. Furthermore, by adjusting the signal attenuation capability of the signal attenuation apparatus, the size of the test space required for wireless signal transmission and reception testing can be reduced. Additionally, the method for measuring power consumption of the image capturing apparatus disclosed herein automates the process of measuring the power consumed when the image capturing apparatus performs various functions, thereby reducing the manpower required for power consumption measurement.

What is claimed is:

1. A system for measuring power consumption of an image capturing apparatus, wherein the system is adapted to measure a power consumption value of a power supplier installed in the image capturing apparatus operated in different modes, and is characterized in comprising:

a signal shielding box for shielding wireless signals originating from outside of the signal shielding box;

an external antenna mounted on an outer side of the signal shielding box and configured to transmit wireless signals;

a wireless signal accessing apparatus disposed within the signal shielding box;

a signal attenuation apparatus disposed within the signal shielding box, wherein the signal attenuation apparatus is configured to transmit and receive an internal electronic signal to and from the wireless signal accessing apparatus through a wired connection, and to transmit an external electronic signal through the external antenna, wherein the external electronic signal is obtained by attenuating a signal strength of the internal electronic signal by a predetermined ratio;

a light emitting apparatus configured to emit light to illuminate a test space captured by the image capturing apparatus;

a heating apparatus comprising a heating portion and a non-heating portion;

a temperature sensing apparatus configured to sense temperature of the heating portion for obtaining a heating portion temperature and to sense temperature of the test space for obtaining an ambient temperature; and a processor electrically coupled to the signal attenuation apparatus, the light emitting apparatus, the heating apparatus, the temperature sensing apparatus and the image capturing apparatus, respectively, wherein the processor is configured to provide an adjustment signal to the signal attenuation apparatus to control the predetermined ratio, to provide an illumination control signal to the light emitting apparatus to control whether the light emitting apparatus emits light, and to provide a heat control signal to the heating apparatus to control whether the heating apparatus operates, wherein, the processor obtains the heating portion temperature and the ambient temperature from the temperature sensing apparatus to determine whether the heating apparatus operates based on the heating portion temperature and the ambient temperature, and obtains a power status of the power supplier from the image capturing apparatus to provide the power consumption value accordingly.

2. The system according to claim 1, wherein the processor comprises:

a power monitoring apparatus electrically coupled to the image capturing apparatus for obtaining the power status; and a control apparatus electrically coupled to the signal attenuation apparatus, the light emitting apparatus, the heating apparatus, the temperature sensing apparatus, the image capturing apparatus and the power monitoring apparatus, respectively, wherein the control apparatus is configured to provide the adjustment signal to the signal attenuation apparatus, provide the illumination control signal to the light emitting apparatus, provide the heat control signal to the heating apparatus, determine whether the heating apparatus operates based on the heating portion temperature and the ambient temperature obtained from the temperature sensing apparatus, and provide the power consumption value based on variation of the power status obtained from the power monitoring apparatus.

3. The system according to claim 1, wherein the heating portion and the non-heating portion are alternately oriented to face the image capturing apparatus while the heating apparatus operates.

4. The system according to claim 3, wherein the heating apparatus rotates at a fixed position such that the heating portion and the non-heating portion are alternately oriented to face the image capturing apparatus.

* * * * *